(12) United States Patent
Krainak

(10) Patent No.: US 8,547,531 B2
(45) Date of Patent: Oct. 1, 2013

(54) IMAGING DEVICE

(75) Inventor: Michael A. Krainak, Fulton, MD (US)

(73) Assignee: The United States of America as represented by the Administrator of the National Aeronautics Space Administration, Washington, DC (US)

( * ) Notice: Subject to any disclaimer, the term of this patent is extended or adjusted under 35 U.S.C. 154(b) by 401 days.

(21) Appl. No.: 12/873,373

(22) Filed: Sep. 1, 2010

(65) Prior Publication Data

US 2012/0050715 A1    Mar. 1, 2012

(51) Int. Cl.
*G01C 3/08* (2006.01)

(52) U.S. Cl.
USPC ......... 356/4.01; 356/3.01; 356/4.1; 356/5.01; 356/5.1

(58) Field of Classification Search
USPC ............ 356/3.01–3.15, 4.01–4.1, 5.01–5.15, 356/6–22, 28, 28.5, 139.01–139.1
See application file for complete search history.

(56) References Cited

U.S. PATENT DOCUMENTS

2008/0291445 A1*  11/2008  Iwane ........................... 356/328
2009/0185159 A1*  7/2009  Rohner et al. ................ 356/5.01

* cited by examiner

*Primary Examiner* — Luke Ratcliffe

(57) ABSTRACT

Disclosed is an apparatus and method for imaging a target area. Light is emitted from a device and separated into individual rays of light. These rays are then directed to a target area where they are reflected and returned to a receiving device. The time of flight for the individual rays of light is calculated to determine the range and shape of objects in the target area.

12 Claims, 4 Drawing Sheets

IMAGING DEVICE

FIELD OF THE INVENTION

The present invention is directed to an imaging device and methods of manufacturing and utilizing the same.

BACKGROUND

Light-based imaging systems, such as light detection and ranging (LIDAR) systems, have been used in a variety of operations to achieve range data from target areas. In its most basic form, LIDAR utilizes a light emitter, typically a laser emitter, and a light receiver, such as a photodetector. The light emitter directs light to a target area. Upon striking objects in the target area, a portion of the light is reflected back to a light receiver which registers the reflected light. By measuring the difference in time between when the light is emitted and when reflected light is received, the distance from the system to objects in the target area may be determined. This information may be used to create a topographical image of the target area.

Typical LIDAR systems utilize either a scanning beam of light or a single flash of light. Scanning systems comprise a series of mirrors to control the position of a laser beam as it is scanned across a target area. The laser is pulsed at a high rate, and the time of return is recorded for each pulse. Flash systems emit a single flash of light, which covers an entire target area, eliminating the need for scanning mirrors and a repeatedly pulsed laser. Flash systems typically utilize a photodetector array so that different parts of the array correspond to different locations in the target area. Because these systems only create range data, they are often connected to global positioning systems to provide location information of the target area.

LIDAR systems can provide numerous advantages in a variety of fields, for instance, surveying and topographical mapping. Aircraft or satellites may be fitted with LIDAR systems to acquire information such as terrain elevation, presence of objects such as trees, or determining the changes in shore lines.

SUMMARY

In an exemplary embodiment, the invention is directed to an imaging device. A light emitting device emits a beam of light. The beam of light is passed through a first lens array having a plurality of lens elements. The light then passes through a second lens array having a plurality of lens elements. The second lens array is positioned at the focal length of the first lens array. The first lens array and the second lens array combine to separate said light into individual rays of light. The imaging device further comprises a receiving device having a detector array with a plurality of detector elements for receiving individual rays of light.

In an exemplary embodiment, the invention is directed to a method of acquiring data relating to a target area. The method comprises the steps of emitting a flash of light and separating the light into an array of individual rays of light. The individual rays of light are directed to a target area. Light reflected from the target area is then received. The time of flight to and from the target area for each individual ray of light is then calculated.

DETAILED DESCRIPTION OF EXEMPLARY EMBODIMENT(S) AND EXEMPLARY METHOD(S)

Figure 1:
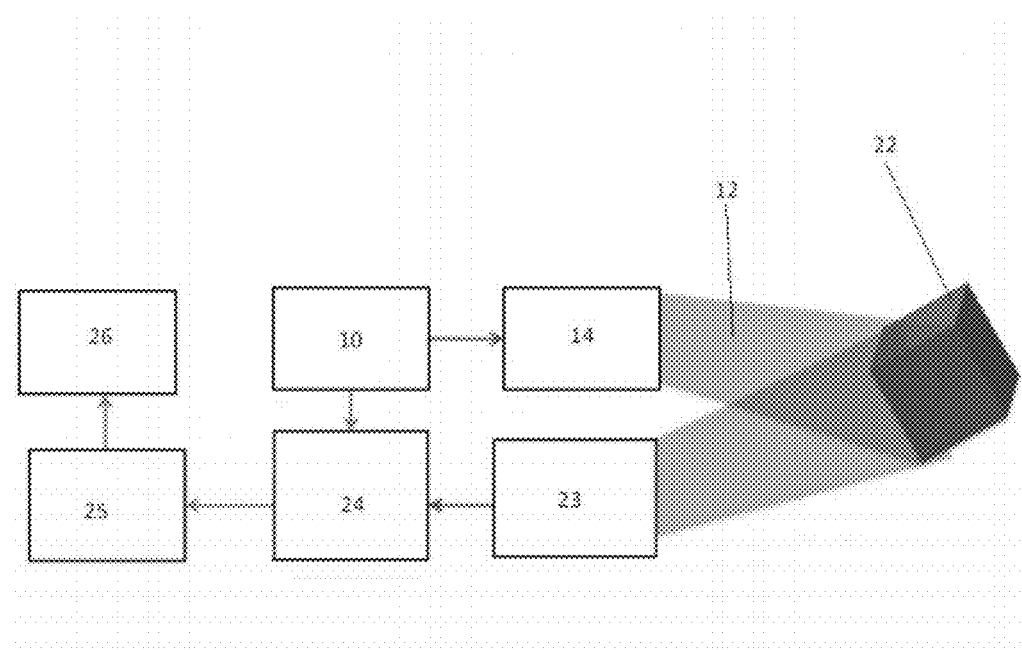
FIG. 1 is a schematic view of an exemplary imaging system.

Reference will now be made in detail to exemplary embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in connection with the exemplary embodiments and methods.

Various exemplary embodiments of the invention are directed to imaging devices and methods utilizing a light source. As best shown in FIG. 1, a light emitter 10 emits a beam of light 12. After exiting the light emitter 10, the beam of light 12 may be passed through a series of optical elements 14. These optical elements 14 may shape and/or direct the light 12. In an exemplary embodiment, part of the optical elements 14 split the beam of light 12 into a plurality of individual rays of light 18 which are directed onto a target area 22. The rays of light 18 strike the target area 22 and are reflected back to a receiving device 23. The receiving device 23 may be connected to a calculating device 24, which determines the time of flight for the rays of light 18 to reach the target area and return to the receiving device 23. To do so the calculating device 24 will have a timing device (not shown) such as a timing circuit, serial clock, or other device as known in the art. The calculating device 24 also receives a signal from the light emitter 10 indicating that the beam of light 12 has been emitted. By determining the time of flight and knowing the speed of light, the distance from the light emitter 10 and individual points in the target area 22 may be determined. This range calculation can be further analyzed by a processing device 25, which may be either an external system or internal to the imaging device. The processing device 25 may compile the data to form an image on a display 26, or it may be used to identify a specific object, such as in a robotic assembly line.

Figure 2:
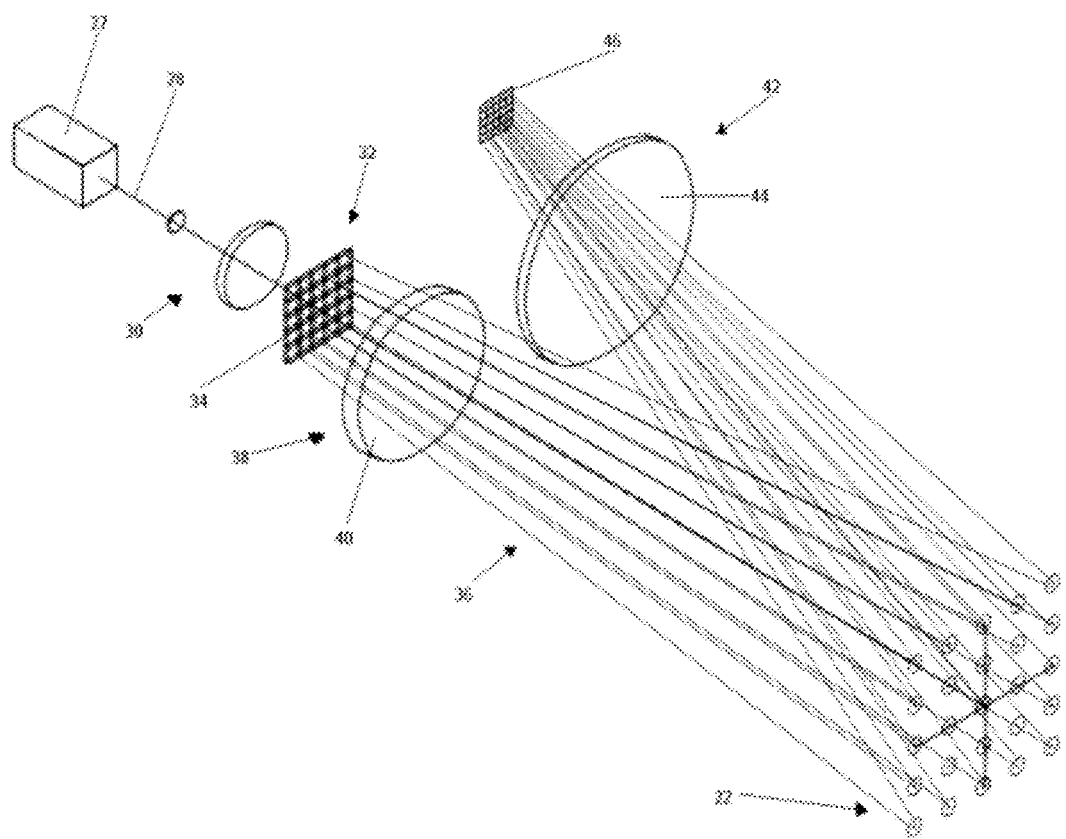
FIG. 2 is a schematic view of various components of an exemplary imaging system.

An exemplary embodiment of the device is shown in greater detail in FIG. 2. In this example, the light emitter 10 is a laser 27 which emits a laser beam 28. The laser 27 may operate in a variety of power ranges and wavelengths. In an exemplary embodiment, the laser 27, or any type of light emitting device 10, operates in a wavelength safe to the human eye, for example at a wavelength of 1.5 µm. While the single laser 27 is shown, the light emitter 10 may be light sources such as multiple lasers, light emitting diodes (LEDs), laser diodes, or other similar light sources. LEDs are less powerful than a laser 27 and therefore may be used in applications where the distance to the target 22 is not great. The laser 27 may be in a variety of housings and attached to a number of different bases and platforms associated with imaging devices. These include both stationary and mobile platforms such as vehicles or automated systems.

After the laser beam 28 is emitted, it may be passed through a first optical element 30. The various examples and embodiments of optical elements described throughout this disclosure are not necessarily meant to be limiting. In LIDAR systems, a variety of optical elements such as mirrors, lenses, and telescopes can be used alone or in combination to provide various affects to an emitted beam 28 as will be understood by one of ordinary skill in the art upon viewing this disclosure. In an exemplary embodiment, the first optical element 30 is an expander lens. The expander lens may be a Galilean beam expander which utilizes a negative focal length lens and a positive lens. Additionally, the expander lens may be a Keplerian beam expander which utilizes a first positive focal length lens and a second positive focal length lens. The first optical element 30 may also be a lens, mirror, or telescope as will be dependent upon the operation and type of light emitter 10. In certain instances, the first optical element 30 may be completely omitted.

Either direct from the laser emitter, or after being passed through the optional first optical element 30, the laser beam 28 enters a second optical element 32 which splits the laser beam 28 into individual rays. In an exemplary embodiment, a lens array 34 is used to perform this function. The number of individual lens elements in the array 34 may vary, so that the array 34 is either one-dimensional or two-dimensional. In an exemplary embodiment, the shape of the array is square, having 32×32 elements. The lens array 34 may have macro or micro size lens elements. Examples of suitable microlens arrays are the microlens arrays created by Suss MicroOptics, the specifications of which are incorporated herein by reference. In an exemplary embodiment, the lens array 34 will generate a uniform array of rays of light 36 so that each ray of light 36 has the same intensity or approximately the same intensity. In another exemplary embodiment, achromatic lenses may used as the elements of the lens array 34. Achromatic lenses will allow a system to distinguish colors, for example, a two color robotic vision system, in addition to providing range information.

Figure 3:
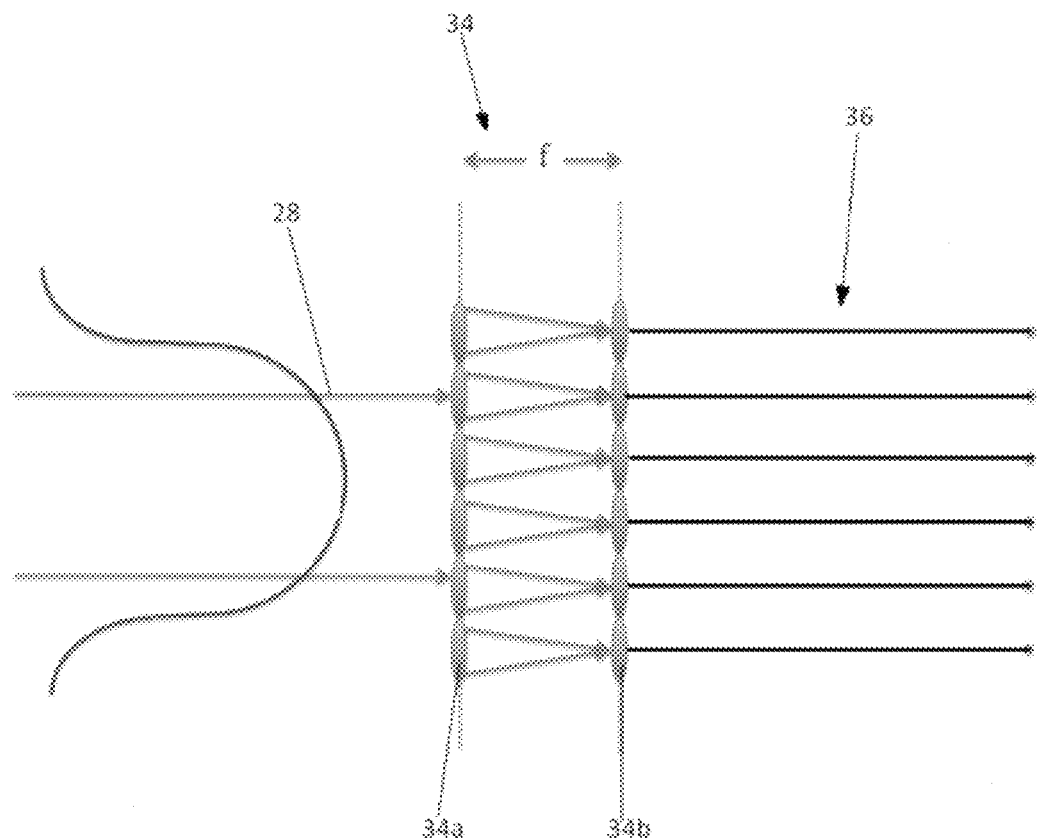
FIG. 3 is a schematic view of an exemplary microlens assembly.

As best shown in FIG. 3, the lens array 34 may comprise a first array 34a and a second array 34b. The laser beam 28 enters the first lens array 34a where the light converges and passes to the second lens array 34b positioned in an opposing relationship, with each lens of array 34a having a counterpart lens in array 34b. In an exemplary embodiment, the lens arrays 34a, 34b are identical, and the distance "f" between the two will be equal to the focal length of the lens arrays 34a, 34b. In this way, the incoming light 28 entering the first array 34a converges to a point as it enters the second array 34b and is then directed to the target area 22 as individual rays 36. By changing the lens arrays 34a, 34b, the overall shape of the ray pattern can be altered. This can control the shape of the pattern created by the rays of light 36, such as by changing the number of rays 36, or controlling the convergence or divergence of the rays 36 as they leave the second lens array 34b.

As mentioned above, the first optical element 30 is optional. This is dependent of the size of the laser beam 28 as it leaves the laser 27 and the size of the lens array 34. If the lens array 34 is larger than the laser beam 28, the lens expander is used to increase the size of the beam 28 so that it matches the lens array 34. Because the amount of expansion caused by beam expanders is mainly dependent on the spacing between the lenses, a single beam expander can be adjusted and used with a variety of lens arrays 34. This however, will also be dependent on the size of the lenses used in the beam expander. Accordingly, the need for the first optical element 30 is dependent on the parameters of the overall system and may be omitted.

After the laser beam 28 is split, the rays of light 36 may be passed through a third optical element 38. For example, a spherical lens 40 can be used to direct the rays of light 36 to the target area 22. The spherical lens 40 may also be used to provide more depth of focus for the rays of light 36 depending on the distance from the emitter 10 to the target area 22. The spherical lens 40 is dimensioned based on the size of the array 34 so that it can properly receive all of the spots 36. The spherical lens 40 directs the rays of light 36 onto the target area 22. The size of the target area depend on the size of the lens array 34, the size of the individual lens elements in the array 34, and the initial size of the laser beam 28 as it enters the array 34. As the rays of light 36 strike objects in the target area 22, the light is reflected back towards the emitter 10. The reflected rays of light are then received by receiving device 23.

In an exemplary embodiment, the receiving device 23 comprises an optical element 42, such as a second spherical lens 44. The second spherical lens 44 directs reflected rays of light 36 onto a detector array 46. The detector array 46 may be a photodetector such as a PIN diode array, an APD array, or a photomultiplier with an array anode. The detector array 46 has an array of individual elements each corresponding to an individual ray of light 36. Thus, the detector array 46 has the same amount of elements as the lens array 34. The detector array 46 converts the light into a signal. This signal is then sent to the calculating device 24.

The calculating device 24 is triggered when the initial pulse of light is sent out. This may be achieved by a signal being sent from the emitter 10, or the calculating device 24 may be equipped with a sensor (not shown) that is capable of detecting when the beam of light 12 is emitted. When an element in the detector array 46 receives a returned pulse of light, a signal sent to the calculating device 24 triggers a threshold detector. The calculating device 24 then determines the amount of time it took for the emitted light to reach the target area 22 and return to the receiving device 23. Depending on the makeup of the calculating device 24, the threshold detector will either stop an ongoing event started by the emission of the light beam 12, or it triggers a second event which can be compared to a first event. The calculating device 24 may have a number of different components as will be understood by those in the art. By determining the time of flight for each ray of light 36, the calculating device 24 is able to determine the distance from the laser 27 to individual objects in the target area. The calculated time of flight can be used to create a three-dimensional image of the target area. This can be used to provide either range information, such as a topographical map, or be used to identify specific objects, such as in automated robot vision.

Figure 4:
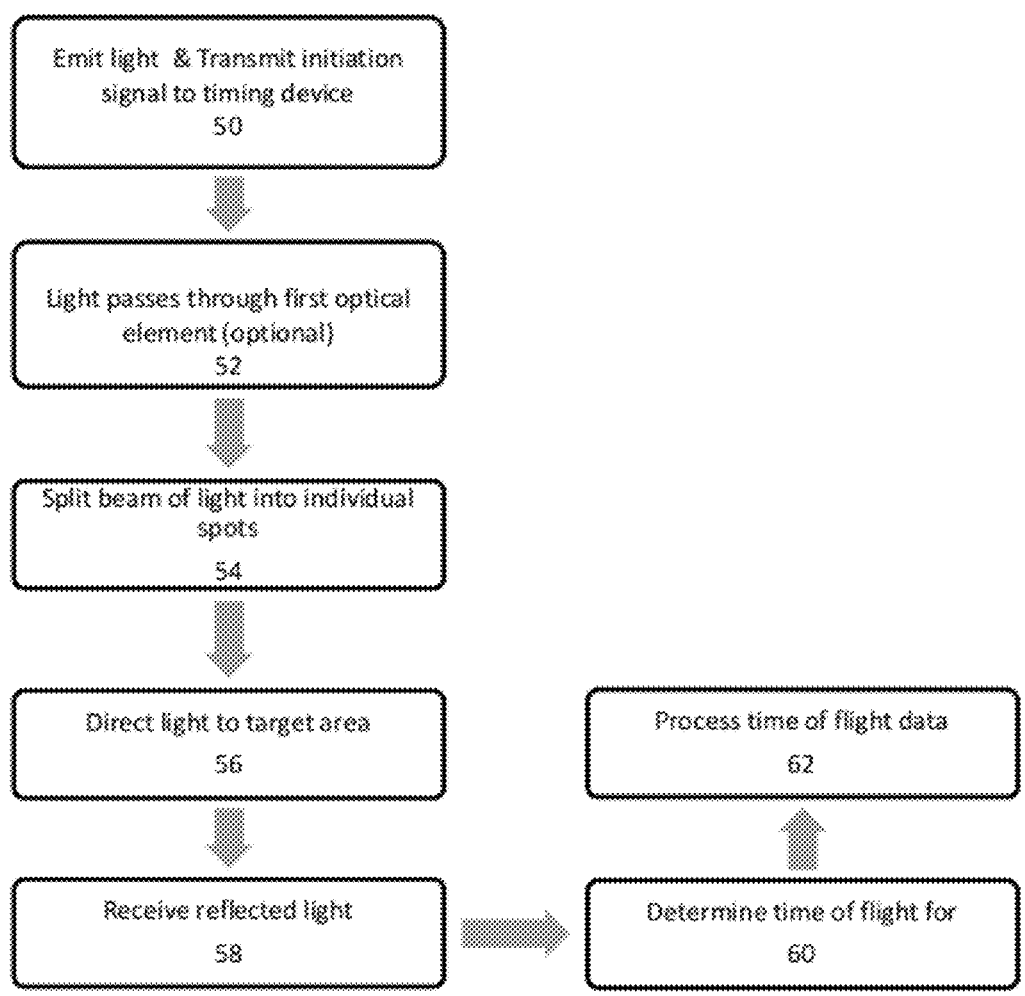
FIG. 4 is a flow chart of an exemplary method for imaging.

Various exemplary embodiments are directed to a method of imaging as best shown in FIG. 4. In step 50, a beam of light is emitted from a light source, for example a laser, and a timing device is started. The beam is optionally then passed through a first optical element in step 52. As discussed above, this optical element may be an expander lens. In step 54, the beam is split into individual rays of light. This may be performed by a lens array or a pair of lens arrays as discussed above. In step 56, the rays of light are directed to a target area. The rays of light may come directly from the previous step or they may be passed through additional optical elements. The rays of light will strike the target area and reflect. The reflected rays of light are then received in step 58 and the timing device is stopped. In step 60, the time of flight for each rays of light is determined. In step 62, this data is processed further, for example to create an image based on the range data or to identify a specific object.

The methods and apparatus for imaging described above provide a number of advantages over typical light imaging systems. For example, the system described above can provide a more detailed image and thus a higher resolution of a target area or object in a shorter amount of time than typical systems. The system may also be easily adjusted, such as by changing or adding simple optics to generate different cone angles for short, medium, or long range applications. Additionally, separating the light into individual rays helps prevent inference associated with adjacent pixel crosstalk between the elements in a typical flash LIDAR detector array. Uniform rays also eliminate the need for calibration and correction algorithms to compensate for non-uniform Gaussian intensity profiles. The use of individual rays also provides for efficient use of the transmitted power, allowing a less powerful light source to be used and uniform intensity to be achieved.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to limit the invention to the precise embodiments disclosed. Additional embodiments are possible and are intended to be encompassed within this specification and the scope of the appended claims. The specification describes specific examples to accomplish a more general goal that may be accomplished in another way.

What is claimed is:

1. A LIDAR imaging device comprising:
a light emitting device for emitting a beam of light;
a first lens array having a plurality of lens elements for receiving said light from said light emitting device, the first lens array including an expander lens comprising one of a Galilean beam expander which utilizes a negative focal length lens and a positive lens and a Keplerian beam expander which utilizes a first positive focal length lens and a second positive focal length lens, said beam expander increasing the size of said emitted beam of light so that the size of the beam of light is equal to the size of the first lens array;
a second lens array having a plurality of lens elements for receiving light from said first lens array, said second lens array being positioned at the focal length of the first lens array, said first lens array and said second lens array combining to separate said light into individual rays of light; and
a receiving device comprising a detector array having a plurality of detector elements for receiving said individual rays of light, wherein the receiving device optionally connected to a calculating device which determines a time of flight for rays of light to reach a predetermined target area and return to the receiving device with the calculating device having a timing device and receiving a signal from the light emitting device for indicating that the beam of light has been emitted and received, respectively, whereby determining the time of flight based on the speed of light and determining the distance from the light emitting device and individual points in the target area.

2. An imaging device according to claim 1, wherein said first and second lens arrays are microlens arrays.

3. An imaging device according to claim 1, wherein said first lens array and said second lens array have the same number of elements.

4. An imaging device according to claim 3, wherein said detector array has the same number of elements as said first and second lens arrays.

5. An imaging device according to claim 1, further comprising:
an optical element for receiving said rays of light from said second lens array and directing said rays of light towards a target area; and
an optical element for directing the received rays of light onto said detector array.

6. An imaging device according to claim 1, wherein the lens array separates light from said light emitting device into an array of individual rays of light having approximately equal intensity.

7. An imaging device according to claim 1, wherein said light emitting device is a non-scanning, flash laser system.

8. A LIDAR imaging device comprising:
a light emitting device for emitting a beam of light;
a first lens array having a plurality of lens elements for receiving said light from said light emitting device, the first lens array including an expander lens comprising one of a Galilean beam expander which utilizes a negative focal length lens and a positive lens and a Keplerian beam expander which utilizes a first positive focal length lens and a second positive focal length lens, said beam expander increasing the size of said emitted beam of light so that the size of the beam of light is equal to the size of the first lens array;
a second lens array having a plurality of lens elements for receiving light from said first lens array, said second lens being positioned at the focal length of the first lens array, said first lens array and said second lens array combining to separate said light into individual rays of light;
a first optical element for directing said rays of light to a target area;
a receiving device comprising a detector array having a plurality of elements for receiving the individual rays of light reflected from the target area wherein the receiving device optionally connected to a calculating device which determines a time of flight for rays of light to reach a predetermined target area and return to the receiving device with the calculating device having a timing device and receiving a signal from the light emitting device for indicating that the beam of light has been emitted and received, respectively, whereby determining the time of flight based on the speed of light and determining the distance from the light emitting device and individual points in the target area.

9. An imaging device according to claim 8, wherein the first and second lens arrays are microlens arrays.

10. An imaging device according to claim 8, wherein said first optical element is a spherical lens.

11. An imaging device according to claim 8, wherein the number of elements in said first lens array, said second lens array, and said detector array are equal.

12. An imaging device according to claim 8, further comprising a calculating device, said calculating device receiving a signal indicating that light has been emitted from said light emitter and a signal indicating that light has been received by said receiving device and determining the time of flight for the emitted light.

* * * * *